(12) United States Patent
Toyama

(10) Patent No.: US 9,979,137 B2
(45) Date of Patent: May 22, 2018

(54) CIRCUIT BOARD ASSEMBLY AND METHOD OF MANUFACTURING THE SAME

(71) Applicant: JTEKT CORPORATION, Osaki-shi, Osaka (JP)

(72) Inventor: Yuichi Toyama, Owariasahi (JP)

(73) Assignee: JTEKT CORPORATION, Osaka (JP)

( * ) Notice: Subject to any disclaimer, the term of this patent is extended or adjusted under 35 U.S.C. 154(b) by 0 days. days.

(21) Appl. No.: 15/422,851

(22) Filed: Feb. 2, 2017

(65) Prior Publication Data

US 2017/0237204 A1 Aug. 17, 2017

(30) Foreign Application Priority Data

Feb. 12, 2016 (JP) ................. 2016-024740

(51) Int. Cl.
*H05K 7/14* (2006.01)
*H01R 13/66* (2006.01)
*H01R 13/504* (2006.01)
*H01R 43/20* (2006.01)
(Continued)

(52) U.S. Cl.
CPC ......... *H01R 13/665* (2013.01); *H01R 13/504* (2013.01); *H01R 13/6658* (2013.01); *H01R 43/205* (2013.01); *H05K 1/184* (2013.01); *H05K 3/3426* (2013.01); *H05K 2201/10189* (2013.01)

(58) Field of Classification Search
CPC ... H05K 1/02; H05K 1/11; H05K 1/14; H05K 5/02; H05K 5/03; H05K 5/06; H05K 7/14; H01R 24/00; H01R 24/66

USPC ....... 361/810, 140, 502, 503, 530, 752, 759, 361/803; 362/190, 509, 546; 439/76.1, 439/233, 405, 483, 607.04, 607.44, 439/607.58, 638, 676
See application file for complete search history.

(56) References Cited

U.S. PATENT DOCUMENTS 4,226,491 A * 10/1980 Kazama ................... H05K 1/02
    361/759
4,392,701 A * 7/1983 Weidler ................ H01R 31/02
    439/405

(Continued)

FOREIGN PATENT DOCUMENTS

DE 102013223309 A1 6/2014
JP 2015191995 A 11/2015

OTHER PUBLICATIONS

Jul. 4, 2017 Extended Search Report issued in European Patent Application No. 17154866.2.

*Primary Examiner* — Xiaoliang Chen
(74) *Attorney, Agent, or Firm* — Oliff PLC

(57) ABSTRACT

A circuit board assembly and a method of manufacturing the same is provided, by which, when external pressure is applied to a cover, deformation of the cover caused by the external pressure is suppressed and no adverse effect is produced to electronic components on a circuit board. A cover of a circuit board assembly includes a first cover to cover a first surface of a circuit board and a second cover to cover a second surface of the circuit board. A projection portion projects from an inner surface of the first cover. When a complete circuit board assembly is formed by insert-molding using the circuit board assembly as an insert part, the projection portion suppresses deformation of the first cover and the second cover.

7 Claims, 4 Drawing Sheets

(51) Int. Cl.
   *H05K 1/18*     (2006.01)
   *H05K 3/34*     (2006.01)

(56) References Cited

U.S. PATENT DOCUMENTS

| | | | | |
|---|---|---|---|---|
| 5,280,949 A | * | 1/1994 | Manabe | B60R 21/2035 280/731 |
| 2002/0028089 A1 | * | 3/2002 | Yoneda | G03G 15/2064 399/122 |
| 2005/0122664 A1 | * | 6/2005 | Takahashi | H01G 9/016 361/530 |
| 2005/0128684 A1 | * | 6/2005 | Miyaki | H01G 9/155 361/502 |
| 2005/0162812 A1 | * | 7/2005 | Katai | H01G 9/155 361/502 |
| 2005/0214647 A1 | * | 9/2005 | Tanaka | H01M 4/0404 429/233 |
| 2006/0008705 A1 | * | 1/2006 | Iijima | H01M 4/13 429/231.95 |
| 2007/0237031 A1 | * | 10/2007 | Kawashima | G10K 9/22 367/140 |
| 2010/0101857 A1 | * | 4/2010 | Miyamoto | H01R 9/2466 174/559 |
| 2010/0112864 A1 | * | 5/2010 | Huang | H01R 9/032 439/607.44 |
| 2010/0248544 A1 | * | 9/2010 | Xu | H01R 13/6658 439/607.04 |
| 2011/0065328 A1 | * | 3/2011 | Wu | H01R 13/6658 439/660 |
| 2012/0064779 A1 | * | 3/2012 | Wu | H01R 9/032 439/676 |
| 2012/0329333 A1 | * | 12/2012 | Ho | H01R 12/7082 439/660 |
| 2013/0070432 A1 | * | 3/2013 | Kawai | H05K 5/0052 361/752 |
| 2013/0188666 A1 | * | 7/2013 | Hasegawa | G01K 1/16 374/170 |
| 2014/0198467 A1 | * | 7/2014 | Shi | B60R 16/0238 361/752 |
| 2014/0198470 A1 | * | 7/2014 | Shi | H05K 1/144 361/803 |
| 2015/0092432 A1 | * | 4/2015 | Arita | F21S 48/10 362/509 |
| 2015/0092437 A1 | * | 4/2015 | Arita | F21S 48/31 362/546 |
| 2015/0255969 A1 | | 9/2015 | Anami | |
| 2015/0282362 A1 | | 10/2015 | Nuriya et al. | |
| 2017/0325350 A1 | * | 11/2017 | Arita | B60Q 1/0094 |
| 2017/0332505 A1 | * | 11/2017 | Arita | B60Q 1/0094 |

* cited by examiner

CIRCUIT BOARD ASSEMBLY AND METHOD OF MANUFACTURING THE SAME

INCORPORATION BY REFERENCE

The disclosure of Japanese Patent Application No. 2016-024740 filed on Feb. 12, 2016 including the specification, drawings and abstract, is incorporated herein by reference in its entirety.

BACKGROUND OF THE INVENTION

1. Field of the Invention

The present invention relates to a circuit board assembly and a method of manufacturing the same.

2. Description of the Related Art

A circuit board assembly in which a circuit board having electronic components is covered with a cover is conventionally known in Japanese Patent Application Publication No. 2015-191995 (JP 2015-191995 A). In FIG. 9 of JP 2015-191995 A, a periphery of a circuit board is sandwiched between corrugated portions that are provided at edge portions of a pair of covers.

The covers described in JP 2015-191995 A are separated from electronic components mounted on the circuit board. However, when the covers are deformed by external pressure and touch the electronic components, the covers can adversely affect the electronic components themselves and electrical connection between the electronic components and a circuit on the circuit board. In addition, in JP 2015-191995 A, since the corrugated portions, provided at the edge portions of the covers, are formed separated from the covers and the electronic components, the corrugated portions do not improve rigidity to suppress the deformation caused by the external pressure.

SUMMARY OF THE INVENTION

An object of the present invention is to provide a circuit board assembly and a method of manufacturing the same by which, when external pressure is applied to a cover, deformation of the cover caused by the external pressure is suppressed and no adverse effect is produced to electronic components on a circuit board.

A circuit board assembly of a first aspect of the present invention includes a circuit board having an area on which electronic components are mounted, and a cover that surrounds and supports the circuit board. The cover covers the circuit board with a clearance interposed between the cover and a portion of the circuit board, which includes the area. The cover is provided, on its inner surface, with a suppression portion that suppresses the inner surface from approaching the area when external pressure is applied to the cover.

With the above-described structure, the suppression portion provided on the inner surface suppresses the deformation of the cover caused by the external pressure.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
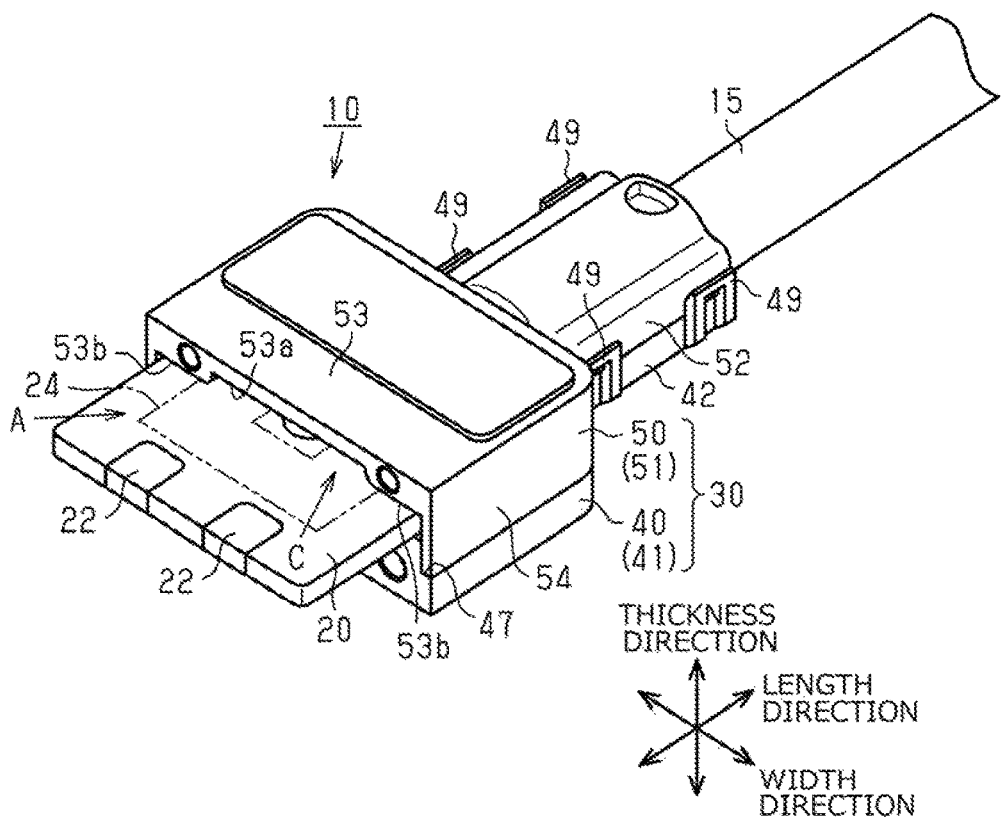
FIG. 1 is a perspective view of a circuit board assembly of an embodiment.
Figure 2:
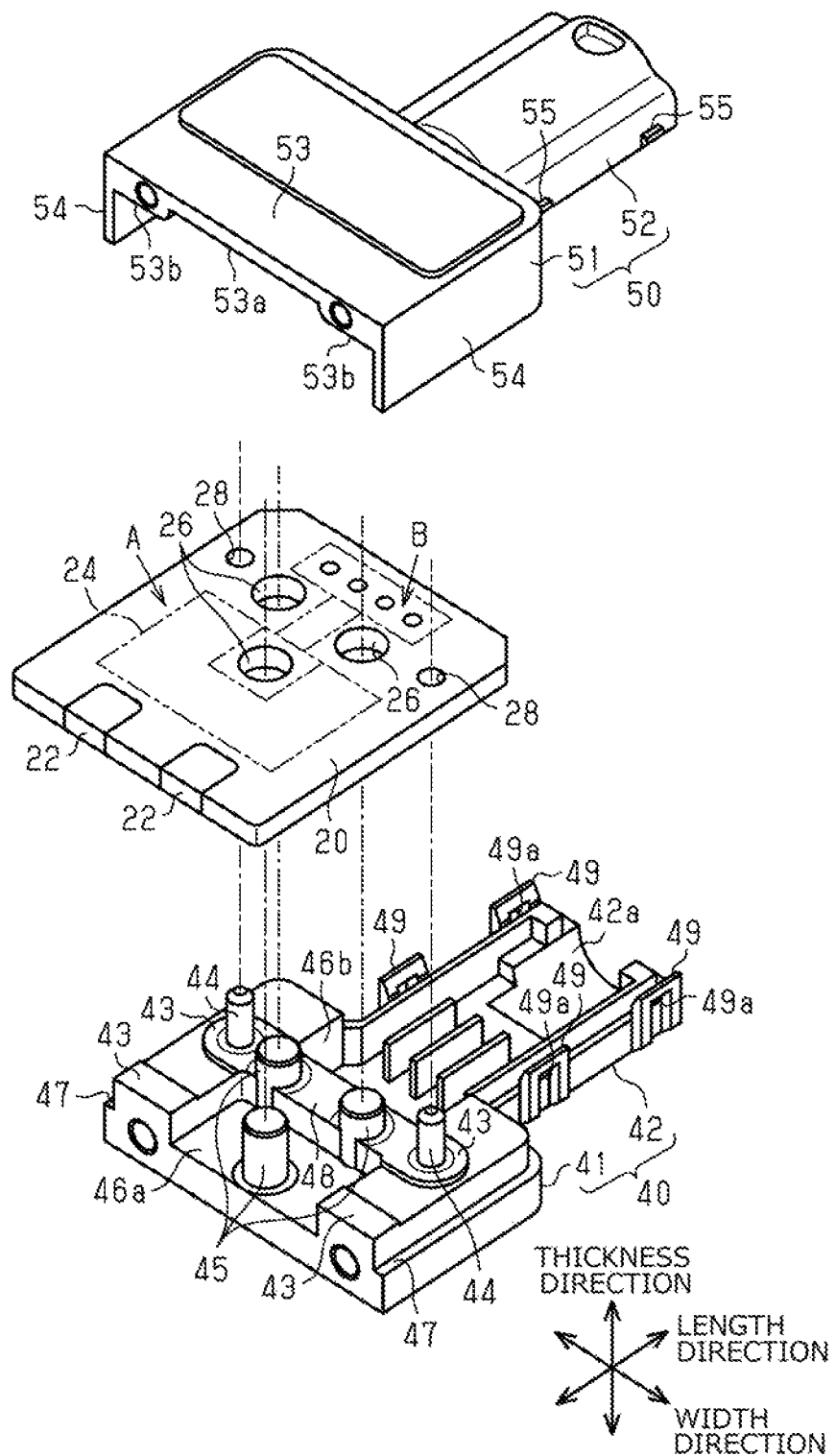
FIG. 2 is an exploded perspective view of the circuit board assembly of the embodiment.

Hereinafter, a circuit board assembly, a complete circuit board assembly, and a method of manufacturing the complete circuit board assembly to which the present invention is embodied will be described with reference to FIGS. 1 to 5. As shown in FIGS. 1 and 2, a circuit board assembly 10 includes a circuit board 20 and a cover 30 to cover part of the circuit board 20.

As shown in FIG. 2, the circuit board 20 is formed like a substantially rectangular plate, and a plurality of sensor devices 22 are fixed to a distal end of the circuit board 20. The circuit board 20 has an area A and an area B on one surface of the circuit board 20. The area A is located in a substantially central portion of the surface, between the distal end and a base end of the board 20, and has a detection signal processing circuit 24 including an integrated circuit (IC, not shown). The area B is located on the base end side, and has a connection terminal (not shown) used to connect the circuit board 20 to a cable 15 (see FIG. 1). The detection signal processing circuit 24 performs a predetermined processing on a signal that is detected by the sensor devices 22, and outputs a processed signal to a controller (not shown) via the connection terminal and the cable 15. The sensor devices 22 may be Hall devices for example, but are not limited thereto. The sensor devices 22 may be other devices.

As shown in FIG. 2, the circuit board 20 is provided with a plurality of through-holes 26 and mounting holes 28, in a portion of the circuit board 20 other than the area A and the area B. Although the number of the plurality of through-holes 26 is three in the present embodiment, the number may be any number as long as the number is the same as that of projection portions 45 described later. Preferably, the through-holes 26 are arranged in a vicinity of the areas A and B.

As shown in FIGS. 1 and 2, the cover 30 includes a first cover 40 and a second cover 50. The first cover 40 is made of synthetic resin, and has a circuit board attachment portion 41 and a cable terminal cover portion 42 integrally joined to a base end of the circuit board attachment portion 41.

The circuit board attachment portion 41 is formed like a thick and substantially rectangular plate, and has recessed portions 46a and 46b formed in an inner surface of the circuit board attachment portion 41, on the distal end side and the base end side of the circuit board attachment portion 41. The recessed portions 46a and 46b are partitioned by a partition wall 48. The recessed portion 46b communicates with a cable-terminal-accommodating recessed portion 42a provided in an inner surface of the cable terminal cover portion 42. The recessed portion 46a is open in a distal end face of the circuit board attachment portion 41.

The circuit board attachment portion 41 has an engagement step portion 47 on both outer faces of the circuit board attachment portion 41 in a width direction, and on a base end face of the circuit board attachment portion 41 except a portion to which the cable terminal cover portion 42 is joined. In the present description, a length direction refers to a direction in which the cable 15 extends, and the width direction refers to a direction that is orthogonal to the length direction and a thickness direction of the circuit board 20, as shown in FIG. 1.

A plurality of board-resting portions 43 are arranged in the width direction on a surface of the circuit board attachment portion 41, which faces the second cover 50, at the distal end and the central portion. In the present embodiment, two rows of the board-resting portions 43 are provided such that the board-resting portions 43 in each row are arranged in the width direction. However, the number of the rows is not limited to this number.

The circuit board 20 is placed on the board-resting portions 43. The board-resting portions 43 which are provided at the central portion of the circuit board attachment portion 41 are each provided with a mounting projection 44. The mounting projection 44 projects toward an inner surface of the second cover 50, which faces the circuit board attachment portion 41, and passes through a corresponding mounting hole 28 of the circuit board 20.

Although not shown, leading ends of the mounting projections 44 passing through the mounting holes 28 are heated in a state where the leading ends project from the circuit board 20, and melted to cover the mounting holes 28 and their peripheries. The melted leading ends are then solidified to adhere to the surface of the circuit board 20, which faces the second cover 50. With this welding, the circuit board 20 is attached and fixed to the circuit board attachment portion 41.

The circuit board 20 is attached to the circuit board attachment portion 41 in the above-described manner. In this state, substantially half the circuit board 20 in the length direction projects from the circuit board attachment portion 41, as shown in FIG. 1. To be specific, the circuit board 20 is arranged such that part of the area A of the circuit board 20 on the distal end side is not covered with the circuit board attachment portion 41. The remaining half of the circuit board 20 including the remaining portion of the area A and the area B is arranged to face the inner surface of the circuit board attachment portion 41.

The circuit board attachment portion 41 is also provided with the plurality of projection portions 45 that serve as suppression portions. The projection portions 45 pass through the through-holes 26 of the circuit board 20, and contact an inner wall surface (described later) of the second cover 50 (see FIG. 3), or project up to points close to the inner wall surface. In the present embodiment, the projection portions 45 include a projection portion projecting from a bottom surface of the recessed portion 46a and a projection portion projecting from the partition wall 48, and are located at positions corresponding to the positions of the corresponding through-holes 26 of the circuit board 20 fixed to the circuit board attachment portion 41.

The number of the projection portions 45 is not limited to more than one, and a single projection portion 45 may be provided. When a later-described molding pressure is applied, a wall portion of the second cover 50 may be deformed. For such a case, it is preferable that the projection portions 45 be disposed at positions at which the projection portions 45 contact the deformed wall portion so that the deformed wall portion does not interfere with electronic components mounted on the circuit board 20.

The second cover 50 is made of synthetic resin, and has a circuit board cover portion 51 and a cable terminal cover portion 52 that is continuous to a base end of the circuit board cover portion 51. The circuit board cover portion 51 has a rectangular-plate-like top wall 53 and side walls 54 formed on a periphery of the top wall 53. The side walls 54 project toward the circuit board attachment portion 41 from the periphery of the top wall 53 except a portion on the distal end side and a portion that is continuous to the cable terminal cover portion 52. The side walls 54 are fitted to the circuit board attachment portion 41, with the end of each side wall 54 being in contact with the engagement step portion 47 of the circuit board attachment portion 41.

Figure 3:
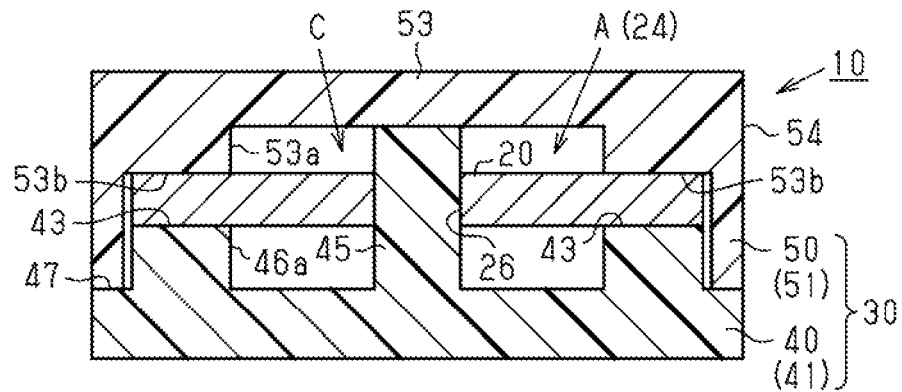
FIG. 3 is a schematic sectional view of an important part of the circuit board assembly of the embodiment.

As shown in FIGS. 1 and 3, the top wall 53 is provided, in its inner surface, with a pair of recessed portions 53a formed on the distal end side and the base end side of the top wall 53. In FIG. 2, only the recessed portion 53a on the distal end side is shown. The pair of recessed portions 53a are partitioned by a partition wall (not shown). The recessed portion 53a on the base end side (not shown) communicates with a cable-terminal-accommodating recessed portion (not shown) provided in an inner surface of the cable terminal cover portion 52. As shown in FIG. 2, the recessed portion 53a on the distal end side is open in a distal end face of the circuit board cover portion 51, and is arranged to face the recessed portion 46a of the circuit board attachment portion 41. The recessed portion 53a forms a clearance between the top wall 53 and a portion of the detection signal processing circuit 24 of the circuit board 20, which portion is covered with the top wall 53 (that is, in the present embodiment, a portion extending from the central portion toward the base end in the length direction).

As shown in FIGS. 1 and 3, a space formed in a state where the inner surface of the circuit board attachment portion 41 (except the engagement step portion 47) and the inner surface of the top wall 53 (except the end faces of the side walls 54 that are engaged with the engagement step portion 47) face each other includes the recessed portions 46a, 53a and a space formed between the board-resting portions 43 and portions 53b of the top wall 53, which face the board-resting portion 43.

The recessed portions 46a, 53a, and the above-described space constitute an accommodation room C that accommodates part of the circuit board 20. In the present embodiment, the accommodation room C is surrounded by the top wall 53 and side walls 54 of the circuit board cover portion 51, and the portion of the circuit board attachment portion 41, which constitutes the outer faces of the circuit board attachment portion 41.

As shown in FIG. 1, the cable terminal cover portion 42 and the cable terminal cover portion 52 are fitted to each other. To be specific, as shown in FIG. 2, both sides of the cable terminal cover portion 42 in the width direction are provided with a plurality of engagement portions 49 having engagement holes 49a, and both sides of the cable terminal cover portion 52 in the width direction are provided with a plurality of locking hooks 55. As shown in FIG. 1, the locking hooks 55 are engaged with the engagement holes 49a, and thus the cable terminal cover portion 52 and the cable terminal cover portion 42 cannot be separated from each other.

The terminal of the cable 15 is accommodated in the cable-terminal-accommodating recessed portion 42a and the cable-terminal-accommodating recessed portion of the cable terminal cover portion 52. Bare wires of the terminal of the cable 15 are connected to the connection terminal provided in the area B.

Next, a method of manufacturing a complete circuit board assembly will be described. The complete circuit board assembly is constituted of the circuit board assembly 10 assembled in the above-described manner and serving as an insert part.

The circuit board assembly 10 is accommodated in a mold (not shown) and mold-clamped. In this mold-clamped state, the portion of the circuit board 20 of the circuit board assembly 10, which is not covered with the cover 30, as shown in FIG. 1, is covered with a covering member (not shown) of the mold so that the portion is not exposed to later-described filling resin (synthetic resin).

Figure 5:
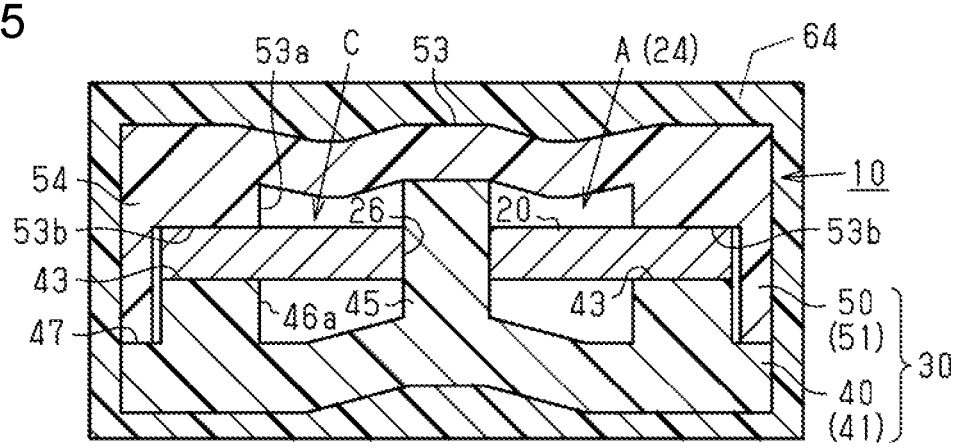
FIG. 5 is a schematic sectional view of an important part of the complete circuit board assembly of the embodiment.

Then, insert molding is performed by filling the cavity of the mold with heated-and-melted synthetic resin using an injection unit (not shown), and by keeping pressure. During this filling with the synthetic resin, molding pressure is applied to outer faces of the circuit board assembly 10. As shown in FIG. 5, this molding pressure (external pressure) deforms the top wall 53 and the circuit board attachment portion 41 inward, or toward the circuit board 20. With this deformation, the projection portions 45 of the circuit board attachment portion 41 contact the inner surface of the top wall 53 to suppress the deformation of the top wall 53 toward the circuit board 20. This prevents the deformed top wall 53 from interfering with electronic components (not shown) on the circuit board 20.

Figure 4:
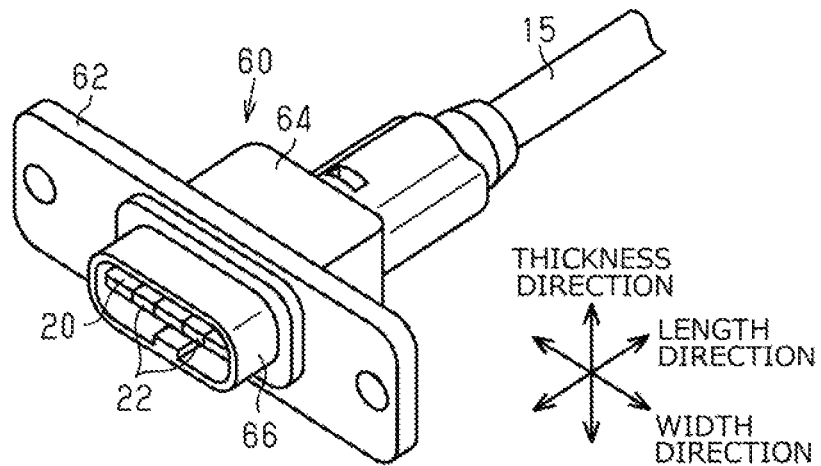
FIG. 4 is a perspective view of a complete circuit board assembly of the embodiment.

The synthetic resin with which the cavity is filled is cooled, and then the mold is opened to obtain a complete circuit board assembly 60 shown in FIG. 4. In an example of FIG. 4, a molding 64 with a flange 62 is formed on the whole cover 30 of the circuit board assembly 10. The molding 64 is provided with a cylinder part 66 having an elliptical cross section and covering the portion of the circuit board 20, which was not covered with the cover 30. The distal end of the cylinder part 66 is open. This molding 64 corresponds to an outer structure.

Advantageous effects of the present embodiment will be described. When the complete circuit board assembly 60 is manufactured by using the above-structured circuit board assembly 10 as an insert part, the projection portions 45 suppress the top wall 53 from deforming toward the circuit board 20. This prevents the deformed top wall 53 from interfering with electronic parts (not shown) on the circuit board 20.

Figure 8:
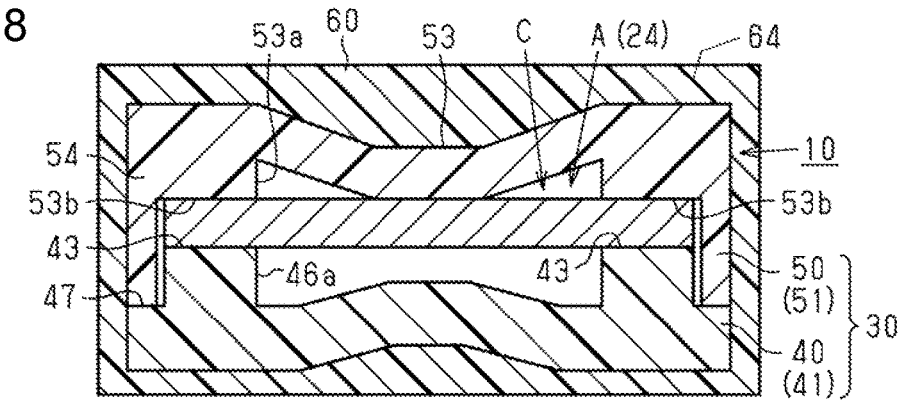
FIG. 8 is a schematic sectional view of an important part of a complete circuit board assembly of a comparative example.

Here, with reference to FIG. 8, a comparative example will be described. In the comparative example which is a conventional example, the projection portions 45 are not provided in the circuit board assembly 10, unlike the above-described embodiment. In such a structure, when the insert molding is performed by filling the cavity of a mold with heated-and-melted synthetic resin using an injection unit (not shown), and by keeping pressure, the molding pressure (external pressure) deforms the top wall 53 and the circuit board attachment portion 41 inward, or toward the circuit board 20, as shown in FIG. 8. Since the projection portions 45 are not provided, the deformation of the top wall 53 toward the circuit board 20 is not suppressed, causing the deformed top wall 53 to interfere with electronic components (not shown) on the circuit board 20.

In the present embodiment, the following effects can be produced.

(1) The circuit board assembly 10 of the present embodiment has the projection portions (suppression portions) 45 on an inner surface of the cover 30. The projection portions 45 suppress an inner surface of the cover 30 from approaching the area on which electronic components are mounted. Thus, the electronic components on the circuit board cannot be adversely affected.

(2) The cover 30 of the circuit board assembly 10 of the present embodiment includes the first cover 40 to cover the first surface of the circuit board 20 and the second cover 50 to cover the second surface of the circuit board 20. The projection portions (suppression portions) 45 project from the first cover 40. Thus, with the cover 30 including the first cover 40 and the second cover 50 and with the projection portions 45 projecting from the first cover 40, the effect of (1) can be produced.

(3) The complete circuit board assembly 60 of the present embodiment has the projection portions (suppression portions) 45 on an inner surface of the cover 30. The projection portions 45 suppress the inner surface from approaching the area on which electronic components are mounted, when the external pressure is applied to the cover 30 in the insert molding of the molding (outer structure) 64.

In the case where the complete circuit board assembly 60 is manufactured by using the circuit board assembly 10 as an insert part, the projection portions (suppression portions) 45 are disposed on the inner surface so as to project through the circuit board 20 toward an opposite inner surface of the cover 30. Thus, when the synthetic-resin molding (outer structure) 64 is formed on the outer faces of the cover 30 by the insert molding, the projection portions (suppression portions) 45 suppress the inner surfaces of the cover 30 from being deformed by the molding pressure and approaching the circuit board 20. As a result of this, the electronic components on the circuit board cannot be adversely affected.

The present embodiment may be modified as below. Although, in the above-described embodiment, the circuit board assembly 10 is used as an insert part of the complete circuit board assembly 60, the circuit board assembly 10 may be used as the complete circuit board assembly, instead of the insert part. Even in this case, the provision of the projection portions 45 can suppress the top wall 53 and the circuit board attachment portion 41 from deforming toward the circuit board 20, when the external pressure is applied to the cover 30.

In the above-described embodiment, the projection portions 45 serving as the suppression portions may be provided on the top wall 53. Furthermore, instead of the through-holes 26 of the above-described embodiment, cutouts or grooves indented from side portions may be formed.

Although the single circuit board 20 is provided in the above-described embodiment, a plurality of circuit boards may be provided, adjacent to each other. Although the accommodation room C of the circuit board assembly 10 of the above-described embodiment accommodates part of the circuit board 20, it may accommodate the entire circuit board 20.

Figure 6:
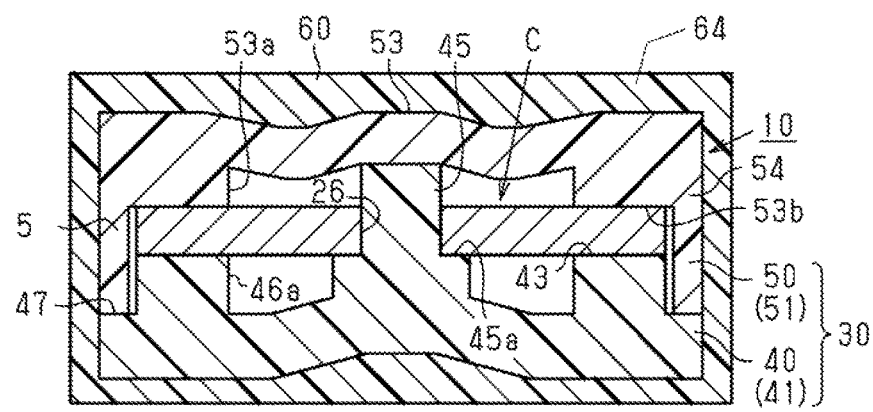
FIG. 6 is a schematic sectional view of an important part of a complete circuit board assembly of another embodiment.

As shown in FIG. 6, the projection portion 45 may be provided with a locking step portion 45a. The locking step portion 45a may be locked by the circuit board 20 when the top wall 53 and the circuit board attachment portion 41 deforms toward the circuit board 20. In this case, the locking step portion 45a can suppress the deformation of the circuit board attachment portion 41 toward the circuit board 20. With such a structure, in a case where electronic components are mounted on the circuit board 20 on the circuit board attachment portion 41 side, it is possible to prevent the deformed circuit board attachment portion 41 from interfering with the electronic components.

Figure 7:
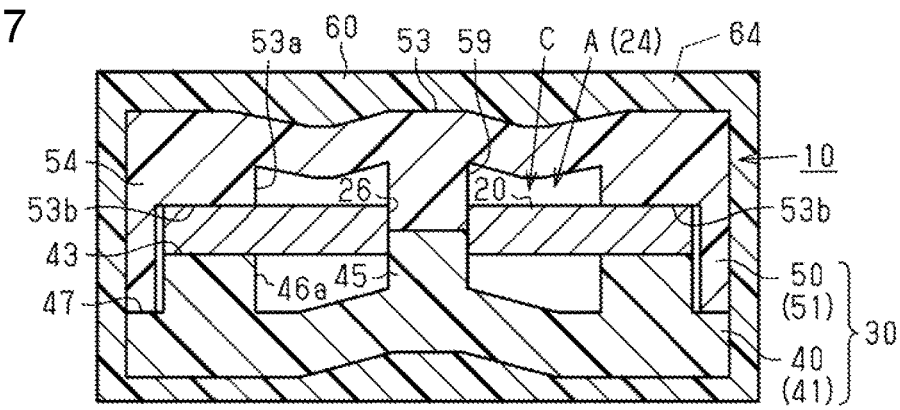
FIG. 7 is a schematic sectional view of an important part of a complete circuit board assembly of another embodiment.

As shown in FIG. 7, a projection portion 59 may be provided on the top wall 53 so as to contact the projection portion 45 provided on the circuit board attachment portion 41. FIG. 7 shows a structure in which the projection portion 59 and the projection portion 45 contact each other in the through-hole 26 of the circuit board 20. The position at which the projection portions 59 and 45 contact each other is not limited to a position in the through-hole 26 of the circuit board 20, and may be a position outside the through-hole 26.

Representative examples of the electronic components herein include the following components, but are not limited thereto. Examples of active components include, for example, semiconductors, transistors, integrated circuits, and diodes. Examples of passive components include, for example, resistors, capacitors, coils, transformers, relays, piezoelectric elements, and oscillators. Examples of mechanical components include, for example, connectors, sockets, plugs, switches, fuses, heat sinks, and antennas. In addition, examples of circuits include, for example, control circuits, sensor circuits, connection circuits (connection terminals), but are not limited thereto.

The invention claimed is:

1. A circuit board assembly comprising:
   a circuit board having an area on which electronic components are mounted; and
   a cover that surrounds and supports the circuit board, the cover covering the circuit board with a clearance interposed between the cover and a portion of the circuit board, which includes the area, wherein
   the cover includes, on an inner surface thereof, a suppression portion that suppresses the inner surface from approaching the area when external pressure is applied to the cover, and the suppression portion extends through the circuit board at a central portion of the circuit board.

2. The circuit board assembly according to claim 1, wherein
   the cover includes a first cover to cover a first surface of the circuit board and a second cover to cover a second surface of the circuit board; and
   the suppression portion projects from at least one of the first cover and the second cover.

3. The circuit board assembly according to claim 2, wherein
   the suppression portion is a projection portion projecting from a first portion of the inner surface of the cover and passing through the circuit board; and
   a leading end of the projection portion is positioned such that the leading end contacts or is allowed to contact a second portion of the inner surface of the cover, the second portion facing the first portion.

4. The circuit board assembly according to claim 2, wherein
   the suppression portion is constituted of a first projection portion and a second projection portion projecting from portions of the inner surface of the cover;
   the portions of the inner surface of the cover face each other; and
   the first projection portion is positioned such that the first projection portion passes through the circuit board and contacts or is allowed to contact a leading end of the second projection portion.

5. A complete circuit board assembly comprising:
   the circuit board assembly according to claim 1; and
   an outer structure made of synthetic resin and covering outer faces of the cover of the circuit board assembly, wherein
   an inner surface of the cover is provided with a suppression portion that suppresses the inner surface from approaching the area.

6. The circuit board assembly according to claim 1, wherein the suppression portion comprises three projection portions arranged in a triangle.

7. A method of manufacturing a complete circuit board assembly which includes: a circuit board having an area on which electronic components are mounted; and a cover that surrounds and supports the circuit board, the cover covering the circuit board with a clearance interposed between the cover and a portion of the circuit board, which includes the area; an outer structure made of synthetic resin which covers outer faces of the cover,
   the method comprising:
   accommodating the cover in a mold as an insert, the cover containing the circuit board; and
   insert-molding the outer structure on outer faces of the cover that contains the circuit board, wherein
   a first inner surface of the cover is provided with a suppression portion that projects toward second inner surface of the cover and extends through the circuit board at a central portion of the circuit board, the first and second inner surfaces facing each other via the circuit board; and
   the suppression portion suppresses the first and second inner surfaces of the cover from being deformed by molding pressure and approaching the circuit board when the outer structure is insert-molded.

* * * * *